US008236466B2

(12) United States Patent
Morimitsu et al.

(10) Patent No.: US 8,236,466 B2
(45) Date of Patent: Aug. 7, 2012

(54) PHOTOCHROMIC MATERIALS INCORPORATED IN POLYMER BACKBONE

(75) Inventors: Kentaro Morimitsu, Mississauga (CA); Gabriel Iftime, Mississauga (CA); Peter M. Kazmaier, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 449 days.

(21) Appl. No.: 12/571,881

(22) Filed: Oct. 1, 2009

(65) Prior Publication Data

US 2011/0082035 A1 Apr. 7, 2011

(51) Int. Cl.
*G03F 7/00* (2006.01)
*G03F 7/004* (2006.01)
*G03F 7/40* (2006.01)

(52) U.S. Cl. .................. 430/19; 430/270.1; 430/270.15; 430/330; 430/945

(58) Field of Classification Search .................... 430/19, 430/270.1, 270.15, 330, 945
See application file for complete search history.

(56) References Cited

U.S. PATENT DOCUMENTS

| | | | | |
|---|---|---|---|---|
| 4,026,869 | A * | 5/1977 | Evens et al. | 528/185 |
| 6,479,604 | B1 * | 11/2002 | Kim et al. | 526/242 |
| 7,410,750 | B2 * | 8/2008 | Chopra et al. | 430/345 |
| 7,666,558 | B2 * | 2/2010 | Iftime et al. | 430/19 |
| 2005/0269556 | A1 * | 12/2005 | Evans et al. | 252/586 |
| 2006/0001944 | A1 * | 1/2006 | Chopra et al. | 359/265 |
| 2008/0110995 | A1 * | 5/2008 | Iftime et al. | 235/491 |
| 2008/0311489 | A1 * | 12/2008 | Kazmaier et al. | 430/19 |
| 2010/0227760 | A1 * | 9/2010 | Morimitsu et al. | 503/201 |
| 2011/0092364 | A1 * | 4/2011 | Morimitsu et al. | 503/201 |
| 2011/0130279 | A1 * | 6/2011 | Iftime et al. | 503/201 |
| 2011/0215283 | A1 * | 9/2011 | Morimitsu et al. | 252/586 |

* cited by examiner

*Primary Examiner* — Amanda C. Walke
(74) *Attorney, Agent, or Firm* — MH2 Technology Law Group LLP

(57) ABSTRACT

Exemplary embodiments provide compositions and methods for making and using an erasable medium that can include a photochromic layer disposed over a substrate. The photochromic layer can include one or more photochromic molecule-polymer systems, wherein each of the one or more photochromic molecule-polymer systems can include a photochromic molecule covalently bonded within a polymer main chain, the photochromic molecule including one or more photochromic moieties (PM) linked together via a linker.

23 Claims, 5 Drawing Sheets

2,3,3-TRIMETHYL-3H-INDOLE 3-(CHLOROMETHYL)-2-HYDROXY-5-NITROBENZALDEHYDE

2-HYDROXY-3-(HYDROXYMETHYL)-5-NITROBENZALDEHYDE

BIS-HYDROXYMETHYL PHOTOCHROMIC MONOMER

PHOTOCHROMIC MATERIALS INCORPORATED IN POLYMER BACKBONE

DETAILED DESCRIPTION

1. Field of Use

The present teachings relate generally to erasable media and, more particularly, to compositions and methods for making and using erasable media that contain photochromic materials.

2. Background

Erasable media is that which can be reused many times to transiently store images, the images being written on and erased from the erasable media. For example, photochromic paper employs photochromic materials to provide an imageable surface. Typically, photochromic materials can undergo reversible photoinduced color changes in the photochromic containing layer. For example, a light source of a certain wavelength can be used for imaging erasable media, while light and/or heat can be used for inducing erasure of imaged erasable media.

Spiropyrans (SPs) are the most commonly used photochromic molecules used in the erasable media. Typically, an ultraviolet (UV) light exposure converts SPs from a colorless state to a colored state, while the colored state reverts back to the colorless state by a thermal treatment, as shown below:

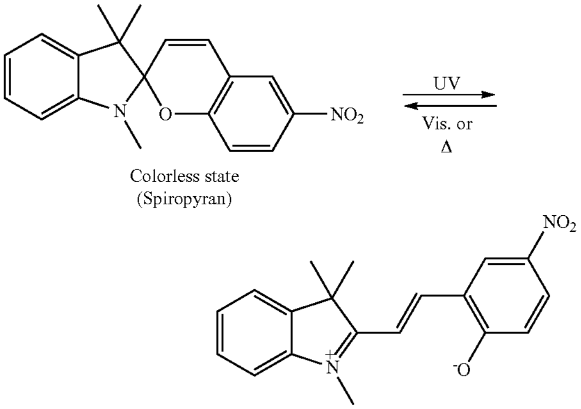

Colorless state (Spiropyran)

Colored state (Merocyanine)

An erasable imaging formulation including spiropyran-polyester systems is the subject of U.S. patent application Ser. No. 12/400,276 filed Mar. 9, 2009 and titled "Reimageable And Reusable Medium And Method of Producing the Reimageable And Reusable Medium" which is commonly assigned with the present application to Xerox Corp., and is incorporated in its entirety herein by reference. The spiropyran-polyester systems showed temperature dependent coloration reaction (writing) coupled with longer image lifetimes when spiropyran molecules were covalently incorporated in a polyester backbone. In addition, the spiropyran-polyester system did not show significant background coloration under ambient lighting conditions. It would be desirable to have general and expanded polymer backbone structures of the photochromic molecule-polymer system for erasable media applications, which can provide a longer image lifetimes and erase-on-demand capabilities.

Thus, there is a need to overcome these and other problems of the prior art and to provide compositions and methods of making erasable media having longer image lifetime.

SUMMARY

In accordance with various embodiments, there is an erasable medium including a photochromic layer disposed over a substrate. The photochromic layer can include one or more photochromic molecule-polymer systems, wherein each of the one or more photochromic molecule-polymer systems can include a photochromic molecule covalently bonded within a polymer main chain as shown below, the photochromic molecule including one or more photochromic moieties (PM) linked together via a linker:

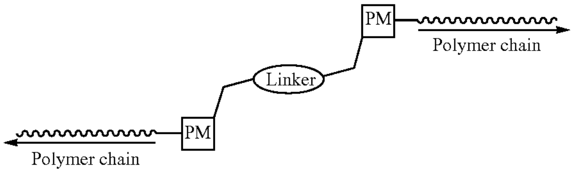

wherein each of the one or more photochromic molecule-polymer systems can have a glass transition temperature in the range of about 30° C. to about 150° C.

In accordance with another embodiment, there is a method of forming an erasable medium. The method can include forming a photochromic initiator, the photochromic initiator including one or more photochromic moieties (PM) linked together via a linker as shown below, each of the one or more photochromic moieties (PM) can include at least one functional group (X) capable of initiating polymerization:

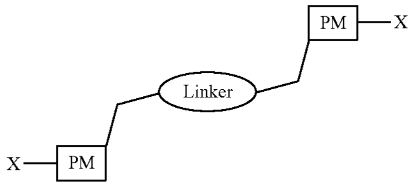

The method of forming an erasable medium can also include forming a photochromic molecule-polymer system by initiating at least one of living radical polymerization, radical polymerization, anionic polymerization, cationic polymerization, or metal mediated polymerization using the at least two functional groups (X) to form a photochromic molecule covalently bonded within a polymer main chain as shown below, the photochromic molecule including one or more photochromic moieties (PM) linked together via a linker:

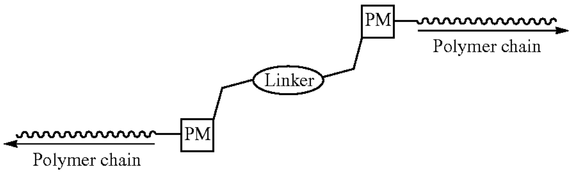

wherein the photochromic molecule-polymer systems can have a glass transition temperature in the range of about 30° C. to about 150° C. The method of forming an erasable medium can further include forming a coating solution of the photochromic molecule-polymer system in a solvent and applying the coating solution over a substrate to form an imageable photochromic layer.

According to yet another embodiment, there is a method of using an erasable medium including providing an erasable medium at an ambient temperature. The erasable medium can include at least one photochromic layer disposed over a substrate, the at least one photochromic layer including one or more photochromic molecule-polymer systems, wherein each of the one or more photochromic molecule-polymer systems can include a photochromic molecule covalently bonded within a polymer main chain as shown below, the photochromic molecule including one or more photochromic moieties (PM) linked together via a linker:

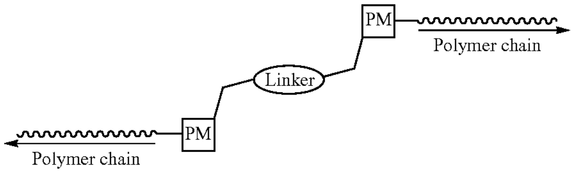

wherein each of the one or more photochromic molecule-polymer systems can have a glass transition temperature in the range of about 30° C. to about 150° C. The method of using an erasable medium can also include exposing a portion of the photochromic layer to both a radiant energy and a temperature in the range of about 30° C. to about 100° C. to form a visible image on the erasable media.

It is to be understood that both the foregoing general description and the following detailed description are exemplary and explanatory only and are not restrictive of the present teachings, as claimed.

The accompanying drawings, which are incorporated in and constitute a part of this specification, illustrate embodiments of the present teachings and together with the description, serve to explain the principles of the present teachings.

Figure 1:
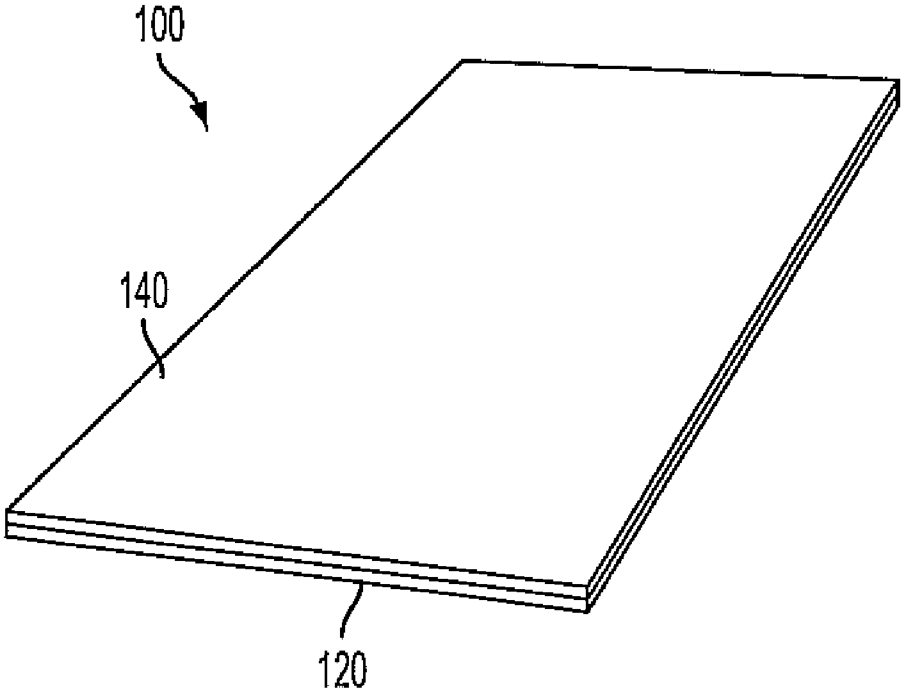
FIG. 1 shows a schematic illustration of an exemplary erasable medium in accordance with various embodiments of the present teachings.

It should be noted that some details of the figures have been simplified and are drawn to facilitate understanding of the embodiments rather than to maintain strict structural accuracy, detail, and scale.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

As used herein, the term "erasable medium" refers to a material including an imaging medium that can be reused multiple times to transiently store and/or remove images and/or documents. The erasable medium can be selectively or locally imaged and erased.

As used herein, the term "imaged erasable medium" refers to an erasable medium bearing a visible image, the image a result of, for example, ultraviolet (UV) writing of the erasable medium.

As used herein, the term "non-imaged erasable medium" refers to an erasable medium which has not been previously imaged, or an erasable medium having an image erased therefrom and available for writing. An exemplary erasable medium is described in connection with FIG. 1 below.

As used herein, the term "non-erasable" refers to traditional media of the type used in any conventional imaging such as ink jet, xerography, or liquid ink electrophotography, as known in the art. An example of a non-erasable traditional medium can be conventional paper.

As used herein, the term "ambient condition" refers to an indoor ambient environment including a light condition that has a light wavelength ranging from about 380 nm to about 750 nm at room temperature ranging from about 20° C. (68° F.) to about 25° C. (77° F.).

In a conventional erasable medium, a visible image is formed by exposing the erasable medium to radiant energy and the visible image is erased by thermal treatment. In contrast, in the disclosed erasable medium shown in FIG. 1, a visible image is formed by exposing the erasable medium to both radiant energy and thermal treatment and the visible image is erased by only thermal treatment.

FIG. 1 depicts an exemplary erasable medium 100 in accordance with various embodiments of the present teachings. It should be readily apparent to one of ordinary skill in the art that the medium 100 depicted in FIG. 1 represents a generalized schematic illustration and that other components can be added or existing components can be removed or modified.

As shown, the erasable medium 100 can include a substrate 120 and a photochromic layer 140 disposed over the substrate 120.

In various embodiments, the substrate 120 can be made of a flexible or a rigid material and can be transparent or opaque. The substrate 120 can include, for example, any suitable material such as plain paper, coated paper, no tear paper, wood, plastics, fabrics, textile products, polymeric films, inorganic substrates such as metals, glass, ceramics, and the like. The paper can include, for example, plain papers such as XEROX® 4024 papers, ruled notebook paper, bond paper, silica coated papers such as Sharp Company silica coated paper, Jujo paper, and the like. The plastic can include, for example, a plastic film, such as polyethylene film, polyethylene terepthalate, polyethylene naphthalate, polystyrene, polycarbonate, polyethersulfone. The substrate 120, such as a sheet of paper, can have a blank appearance. The substrate 120 may have any suitable shape such as planar (e.g., a sheet) or non-planar (e.g., cube, scroll, and a curved shape).

In various embodiments, the substrate 120 can be a single layer or multi-layer where each layer can be the same or different material and can have a thickness, for example, ranging from about 0.1 mm to about 10 mm, in some cases from about 0.2 mm to about 8 mm, and in other cases from about 0.3 mm to about 5 mm.

The photochromic layer 140 can be impregnated, embedded, or coated to the substrate 120, for example, a porous substrate such as paper. In various embodiments, the photochromic layer 140 can be applied uniformly to the substrate 120 and/or fused, or otherwise permanently affixed thereto. In various embodiments, the photochromic layer 140 can have a thickness from about 1 μm to about 1 mm, or in some cases from about 1 μm to about 100 μm, and particularly from about 2 μm to about 50 μm.

In accordance with various embodiments, the photochromic layer 140 can include one or more photochromic molecule-polymer systems, each having a schematic formula (1) as shown below. In various embodiments, each of the one or more photochromic molecule-polymer systems can include a photochromic molecule covalently bonded within a polymer main chain and the photochromic molecule can include one or more photochromic moieties (PM) linked together via a linker as shown below:

(1)

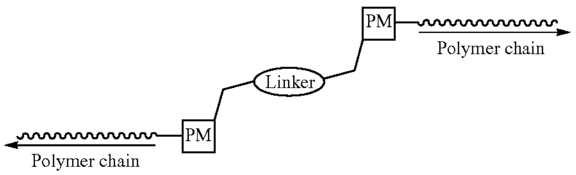

In some embodiments, the photochromic molecule can include two photochromic moieties (PM) linked together via a linker and covalently bonded within a polymer main chain, as shown above in formula (1). In other embodiments, the photochromic molecule can include one photochromic moiety (PM) covalently bonded within a polymer main chain with or without a linker. In some other embodiments, the photochromic molecule can include three or more photochromic moieties (PM) linked together via a linker and covalently bonded within a polymer main chain.

In various embodiments, each of the one or more photochromic molecule-polymer systems can have a glass transition temperature in the range of about 30° C. to about 150° C., in some case in the range of about 30° C. to about 125° C., and in some other cases in the range of about 30° C. to about 100° C.

In various embodiments, a portion of the photochromic layer 140 can change from a colorless state to a colored state to form a visible image upon exposure to a thermal treatment and a radiant energy. While not intending to be bound by any specific theory, it is believed that the photochromic molecule-polymer system undergoes a thermally gated photochromic reaction at or above the glass transition temperature ($T_g$) of the photochromic molecule-polymer system, i.e., the color of the photochromic molecule or the photochromic moieties (PM) changes at or above $T_g$ but does not change below $T_g$. This is because the geometrical structural change is required for the color change of the photochromic moieties (PM) and such molecular motion can be frozen below $T_g$. The temperature dependent photochromism of the photochromic molecule-polymer system not only enables a longer image lifetime but also provides less background coloration in ambient condition.

Hence, a key property that should be controlled is $T_g$ of the photochromic molecule-polymer system. Since the thermal decoloration reaction of the photochromic molecule, i.e. the erasure of the visible image, begins to dominate at temperatures above about 70° C. while coloration reaction (formation of visible image) can occur via radiant energy exposure, it is preferable for the photochromic molecule-polymer system to have a glass transition temperature ($T_g$) of below about 70° C. At the same time, the frozen mechanism of polymer main chain of the photochromic molecule-polymer system should work at room temperature. Consequently, target $T_g$ of the photochromic molecule-polymer system should preferably be in the range of about 30° C. to about 70° C. There are many synthetic polymers available which show $T_g$ in that range such as, for example, nylon, polyethylene, polystyrene, poly (acrylate), and poly(methacrylate). Hence, $T_g$ of the photochromic molecule-polymer system including such polymers can be precisely controlled by choosing proper one or more monomers or varying monomer combination and ratio for copolymers.

In various embodiments, a portion of the photochromic layer 140 can change from the colorless state to the colored state to form a visible image when exposed to a radiant energy and heated at a temperature in the range of about 30° C. to about 150° C., in some case in the range of about 30° C. to about 125° C., and in some other cases in the range of about 30° C. to about 100° C. In some cases, the radiant energy can have a wavelength in the range of about 200 nm to about 475 nm. In other embodiments, the radiant energy can have a single UV light wavelength of about 365 nm. In some other embodiments, the radiant energy can have a wavelength band of from about 350 nm to about 370 nm. In some embodiments, the visible image formed by the exposure to the radiant energy and heat can have an image lifetime of about 4 hours to about 10 weeks. As disclosed herein, the term "image lifetime" refers to the time for the portion of the photochromic layer 140 in the colored state to fully revert or transition back to the colorless state in an ambient condition. In some embodiments, the visible image formed by the exposure to the radiant energy and heat can have an image lifetime of about 12 hours to about 5 weeks. Yet, in some other embodiments, the visible image formed by the exposure to the radiant energy and heat can have an image lifetime of about 24 hours to about 5 days.

In various embodiments, each of the one or more photochromic molecule-polymer systems in the exposed region of the visible image can convert from the colored state to a colorless state when heated to a temperature in the range of about 30° C. to about 150° C., in some case in the range of about 30° C. to about 125° C. and in some other cases in the range of about 30° C. to about 100° C.

Referring back to the photochromic layer 140, the photochromic molecule of the one or more photochromic molecule-polymer systems can include one or more photochromic moieties (PM) linked together via a linker. Any suitable photochromic moiety (PM) can be used, such as, for example, spiropyrans, spirooxazines, thiospiropyrans, benzos, naphthopyrans, stilbenes, azobenzenes, bisimidazols, spirodihydroindolizines, quinines, perimidinespirocyclohexadienones, viologens, fulgides, fulgimides, diarylethenes, hydrazines, anils, aryl thiosulfonates, spiroperimidines, and mixtures thereof. U.S. Pat. No. 7,300,727 discloses in detail a variety of photochromic moieties, the disclosure of which is incorporated by reference herein in its entirety.

Specific examples of spiropyrans, spirooxazines, and thiospiropyrans include 1',3'-dihydro-1',3',3'-trimethyl-6-nitrospiro-[2H-1-benzopyran-2,-2'-(2H)-indole]; 1',3'-dihydro-1',3',3'-trimethyl-5'-nitrospiro-[2H-1-benzopyran-2,2'-(2H)-indole]; 1',3'-dihydro-1',3',3'-trimethyl-6-cyano-spiro-[2H-1-benzopyran-2,2'-(2H)-indole]; 1',3'-dihydro-1',3',3'-trimethyl-8-nitrospiro-[2H-1-benzopyran-2,2'-(2H)-indole]; 1',3'-dihydro-1',3',3'-trimethyl-6-nitro, 8-methoxy-spiro-[2H-1-benzopyran-2,2'-(2H)-indole]; 1',3'-dihydro-1'-decyl-, 3',3'-dimethyl-6-nitrospiro-[2H-1-benzopyran-2,2'-(2H)-indole]; 1,3-dihydro-1,3,3-trimethylspiro[2H-indole-2,3'-[3H]naphth[2,1-b]-[1,4]oxazine]; 1,3-dihydro-1,3,3-trimethyl-5-nitrospiro[2H-indole-2,3'-[3H]naphth[2,1-b]-[1,4]oxazine]; 1,3-dihydro-1,3,3-trimethyl-5,6'-dinitro-spiro[2H-indole-2,3'-[3H]naphth[2,1-b]-[1,4]oxazine]; 1,3-dihydro-1,3,3-trimethyl-5-methoxy, 5'-methoxy-spiro[2H-indole-2,3'-[3H]naphth[2,1-b]-[1,4]oxazine]; 1,3-dihydro-1-ethyl-3,3-dimethyl-5'-nitrospiro[2H-indole-2,3'-[3H]naphth[2,1-b]-[1,4]oxazine]; and 1,3',3'-trimethylspiro[2H-1-benzothiopyran-2,2'-indoline].

A representative methodology for synthesis of spiropyrans is by condensation of a readily available Fisher's base with salicylaldehyde derivatives. Extensive coverage of synthetic procedures and references are described in J. C. Crano and R. J. Guglielmetti, Organic Photochromic and Thermochromic Compounds, Vol. 1, Main Photochromic Families (Topics in Applied Chemistry), Plenum Press, New York (1999), the disclosure of which is totally incorporated herein by reference.

plary linker can include, but is not limited to, sulphur, oxygen, nitrogen, a linear alkyl, a branched alkyl, a cyclic alkyl, unsaturated hydrocarbon, an aryl, an arylalkyl, a heteroaryl group, an ester group, a ketone, an ether group, an amide group, a thioester group, or a thionoester group.

The photochromic molecule-polymer system can include any suitable polymer, such as, for example, polyalkylmethacrylates, polycarbonates, polystyrenes, polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohols, polyacrylic acids and the like. Copolymer materials such as polystyrene-acrylonitriles, polyethylene-acrylates, vinylidenechloride-vinylchlorides, vinylacetate-vinylidene chlorides, styrene-alkyd resins can also be used. The copolymers can be block, random, or alternating copolymers. Particularly, polymers with $T_g$ ranging between about 30° C. and about 70° C. are preferable, such as, for example, nylon-6, nylon-11, nylon-6, 6, nylon-6-10, nylon-6,12, poly(methylpentene), polyethyl methacrylate), poly(n-propyl methacrylate), poly(4-methoxycarbonyl, 3-methyl-1-butenylene), poly(2-cyclohexylehelene), poly(isobutylethlene), poly(1,1,2-trimethylrimethylene), poly(4,4-dimethylpentylethylene), poly(propyl-2-propylene), poly(4-carbanobenzyl acrylate), poly (cyclododecyl acrylate), poly(cyclohexyl acrylate), poly (hexadecyl acrylate), polyp-tolyl acryalate), poly(N-butyl acrylamide), poly(isodecyl acrylamide), poly(phenethyl methacrylate), poly(vinyl fluoride), poly(vinyl acetate), poly (4-isopropylstylene), poly(4-octadecylstylene), and poly (ureylenedecamethyleneureylenetetradecamethylene). In some embodiments, the photochromic layer 140 can include one or more photochromic molecule-polymer systems such as, spiropyran-poly(ethylmethacrylate) (SP-PEMA) and spiropyran-poly(n-propylmethacrylate) (SP-PPMA), as shown below:

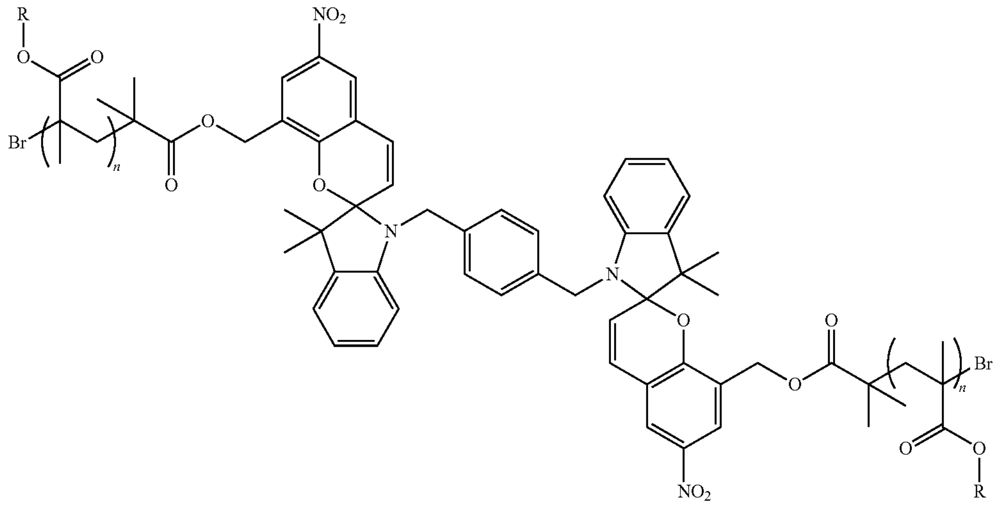

SP-PEMA: R = ethyl
SP-PPMA: R = n-propyl

Referring back to the photochromic layer 140, the photochromic molecule of the one or more photochromic molecule-polymer systems can include any suitable linker for linking the one or more photochromic moieties (PM). Exem- In various embodiments, the photochromic layer 140 can further include optional binder materials. The binder materials can be, for example, a suspending medium to hold the photochromic materials, in this case, the photochromic molecule-polymer system, as a film or layer on the substrate 120 of interest. The binder can provide any or all of the following properties, such as, for example, mechanical flexibility, robustness, and optical clarity. Any suitable binder can be used, for example, a polymer material.

Exemplary polymer materials that can be used as binders include, but are not limited to, polyalkylmethacrylates like polymethylmethacrylates (PMMA), polycarbonates, polystyrenes, polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohols, polyacrylic acids and the like. Copolymer materials such as polystyrene-acrylonitriles, polyethylene-acrylates, vinylidenechloride-vinylchlorides, vinylacetate-vinylidene chlorides, styrene-alkyd resins can also be examples of suitable binder materials. The copolymers can be block, random, or alternating copolymers. U.S. Pat. No. 7,300,727 discloses in detail a variety of binder materials, the disclosure of which is incorporated by reference herein in its entirety.

In various exemplary embodiments, the photochromic molecule-polymer system can be present in the photochromic layer 140 in an amount ranging from about 0.05% to about 99.5% by weight of the total photochromic layer 140. In some embodiments, the photochromic molecule-polymer system can be present in an amount ranging from about 0.1% to about 70% by weight of the total photochromic layer 140. In other embodiments, the photochromic molecule-polymer system can be present in an amount ranging from about 1% to about 20% by weight of the total photochromic layer 140.

Figure 2:
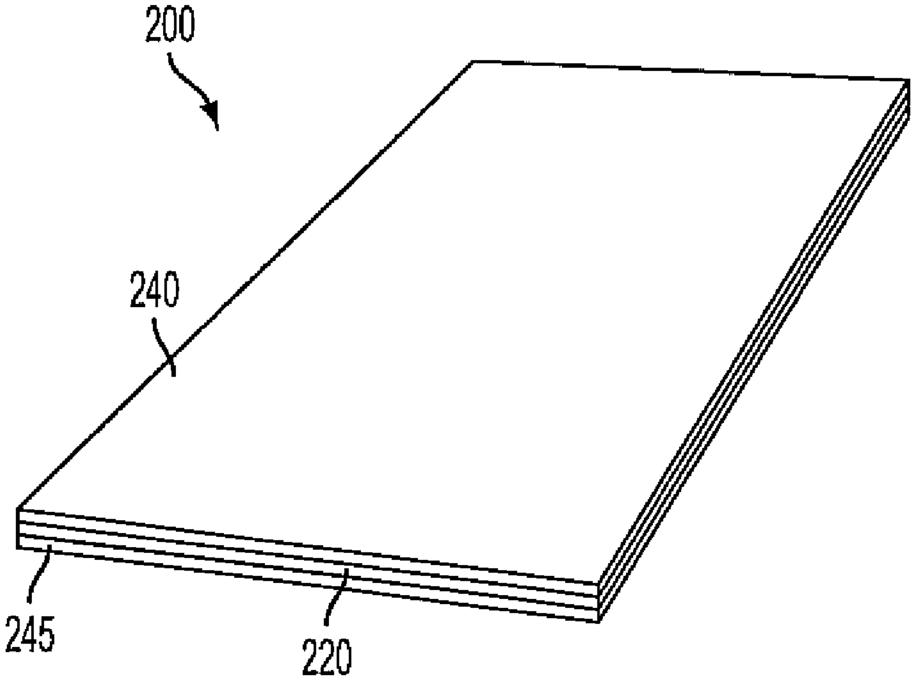
FIG. 2 shows a schematic illustration of another exemplary erasable medium in accordance with various embodiments of the present teachings.

FIG. 2 shows another exemplary erasable medium 200 in accordance with various embodiments of the present teachings. The erasable medium 200 can include a substrate 220, a photochromic layer 240 disposed over the substrate 220, and a second photochromic layer 245 disposed over the substrate on a side opposite to the photochromic layer 240. In various embodiments, the second photochromic layer 245 can include one or more photochromic molecule-polymer systems. In some embodiments, the one or more photochromic molecule-polymer systems of the photochromic layer 240 and the second photochromic layer 245 can be the same. In other embodiments, the one or more photochromic molecule-polymer systems of the photochromic layer 240 and the second photochromic layer 245 can be different.

In certain embodiments, a plurality of erasable medium 100, 200 can also be combined to form a larger erasable surface analogous to a giant display screen composed of a number of smaller display screens.

In various embodiments, the substrate and the erasable medium 100, 200 can have any number of sides such as two (e.g., a sheet of paper), three, four or more sides (e.g., a cube). It is understood that the number of imageable sides (photochromic layer) of the erasable medium can be the same as or fewer than the number of sides of the substrate; for example, where the substrate is a sheet of paper and the photochromic layer is disposed only on one side of the paper, then the erasable medium has only one imageable side even though the substrate is two-sided. As used herein, the phrase "imageable side" refers to the side of the substrate including a imageable photochromic layer. For any imageable side of the erasable medium 100, 200, the entire side or only a portion of the side can be imageable.

In certain embodiments, a protection filter film can be used to locally or wholly cover a photochromic layer 140, 240, 245 bearing visible images of the erasable medium 100, 200. The protection filter film can be, for example, a yellow protection filter film applied over the photochromic layer 140, 240, 245 or can be a free standing film which can be used as a detachable cover. The protection filter film can include any number of light absorbing materials to prevent the reduction in color contrast. If the protection filter film is applied permanently over the photochromic layer 140, 240, 245, then the light absorbing material should ideally adsorb maximally in the region of about 380 nm to about 500 nm and adsorb minimally in the region of about 250 nm to about 380 nm to allow for UV-based imaging of the document. Such combinations of materials exhibit acceptable levels of reduction in color contrast when exposed to ambient UV fluorescent light. The protection filter film can have a thickness of from about 0.005 mm to about 1 mm. In this manner, these embodiments provide a manner of achieving coloration in desired areas and eliminating unwanted reduction in color contrast from the UV light present in indoor ambient conditions. In another embodiment, the light absorbing film may function as a detachable cover for the erasable medium 100, 200 in which the yellow film cover can be slipped over of reversibly attached to the photochromic layer 140, 240, 245 after the photochromic layer 140, 240, 245 is subjected to UV light. In this embodiment, the light absorbing film does not need to be substantially optically transparent in the UV region. Alternatively, a light absorbing dye may be incorporated into the polymer overcoat and or into the photochromic medium itself. Any suitable light absorbing dye may be used so long as the dye is soluble or dispersable in the coating formulation selected. U.S. Pat. No. 7,300,727 discloses a number of light absorbing materials, the disclosure of which is incorporated by reference herein in its entirety.

Exemplary commercially available light absorbing materials include, but are not limited to, BLS®531; BLS®5411; BLS®1710 (Mayzo, Norcross, Ga.); TINUV® 234, TINUV® P, TINUV® 1577 (Ciba Specialty Chemicals Corp, Tarrytown, N.Y.) and are typically used as UV protective layer to prevent photochemical degradation of polymeric coatings.

Figure 3:
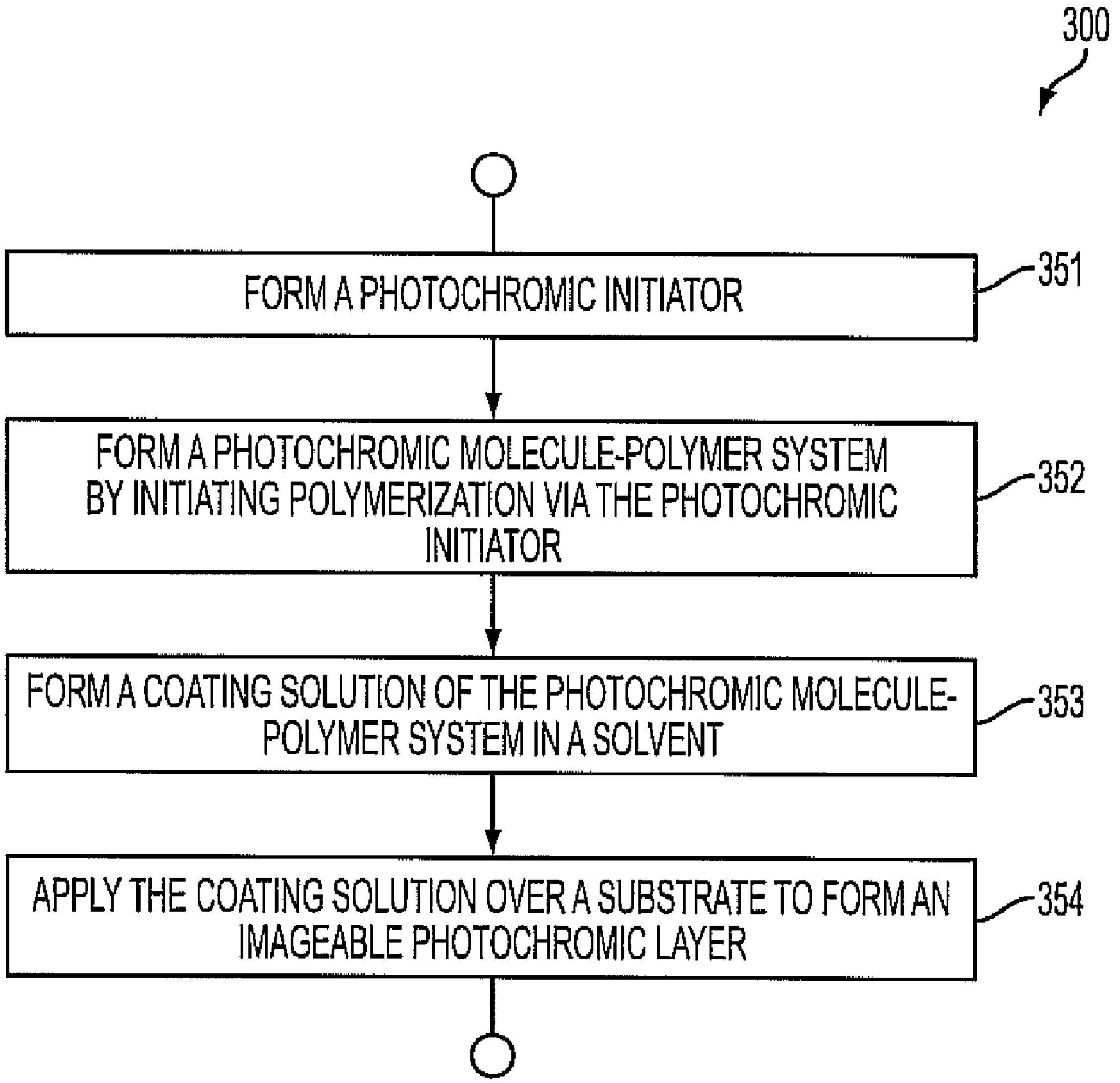
FIG. 3 depicts an exemplary method of forming an erasable medium in accordance with various embodiments of the present teachings.

FIG. 3 depicts an exemplary method 300 of forming an erasable medium, such as, the erasable medium 100, 200 shown in FIGS. 1 and 2, in accordance with various embodiments of the present teachings. The method 300 can include a step 351 of forming a photochromic initiator. The photochromic initiator as shown below can include one or more photochromic moieties (PM) bonded together via a linker and having a schematic formula (2) as shown below:

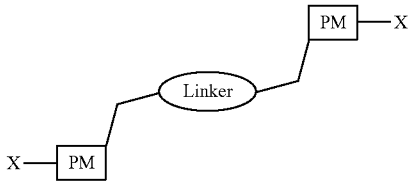

wherein each of the one or more photochromic moieties (PM) can include at least one functional group (X) capable of initiating polymerization, such as, for example, living radical polymerization, radical polymerization, anionic polymerization, cationic polymerization, and metal mediated polymerization.

Any suitable molecule can be used for the photochromic moieties (PM), such as, for example, spiropyrans, spirooxazines, thiospiropyrans, benzos, naphthopyrans, stilbenes, azobenzenes, bisimidazols, spirodihydroindolizines, quinines, perimidinespirocyclohexadienones, viologens, fulgides, fulgimides, diarylethenes, hydrazines, anils, aryl thiosulfonates, spiroperimidines, and mixtures thereof. The photochromic moiety (PM) can include any suitable functional group (X) including, but not limited to, an alkyl halide, a 2,2,6,6-tetramethylpiperidinyloxy (TEMPO) group, and a dithioester group. Exemplary linker can include, but is not limited to, sulphur, oxygen, nitrogen, a linear alkyl, a branched alkyl, a cyclic alkyl, unsaturated hydrocarbon, an aryl, an arylalkyl, a heteroaryl group, an ester group, a ketone, an ether group, an amide group, a thioester group, or a thionoester group.

Referring back to the method 300 of forming an erasable medium, the method 300 can also include a step 352 of forming a photochromic molecule-polymer system having a schematic formula (1) shown below:

(1)

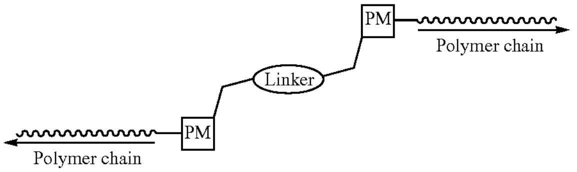

The photochromic molecule-polymer system having a schematic formula (1) can be formed by initiating polymerization using the at least two functional groups (X) of the photochromic initiator having a schematic formula (2) to form a photochromic molecule (PM) covalently bonded within the polymer main chain as shown above. In some embodiments, the photochromic molecule-polymer system (1) can be formed by living radical polymerization. In other embodiments, other polymerization methods, such as, for example, radical polymerization, anionic polymerization, cationic polymerization, and metal mediated polymerization can be used to initiate polymerization via the at least two functional groups of the photochromic initiator (2).

In certain embodiments, the step 352 of forming a photochromic molecule-polymer system can further include adding copper (Cu(0)), ligands, such as, for example, N,N,N',N',N"-pentamethyldiethylenetriamine (PMDETA), tris(2-aminoethyl)amine (TREN), tris(2-dimethylaminoethyl) amine ($Me_6$-TREN), poly(ethylene imine) (PEI), N-n-propyl-2-pyridyl-methanimine, 2,2'-bipyridine (bpy), and one or more monomers selected from the group consisting of alkylmethacrylate, alkylacrylate, acrylamide, vinyl monomer, stylene, acrylonitrile, such as, methyl methacrylate, ethyl methacrylate, n-propyl methacrylate, butyl methacrylate, phenethyl methacrylate, 4-carbanobenzyl acrylate, cyclododecyl acrylate, cyclohexyl acrylate, hexadecyl acrylate, p-tolyl acryalate, N-butyl acrylamide, isodecyl acrylamide, vinyl acetate, 4-isopropylstylene, 4-octadecylstylene, and vinyl fluoride.

In various embodiments, the photochromic molecule-polymer systems can have a glass transition temperature in the range of about 30° C. to about 150° C., in some case in the range of about 30° C. to about 125° C., and in some other cases in the range of about 30° C. to about 100° C.

The method 300 of forming an erasable medium 100, 200 can further include a step 353 of forming a coating solution of the photochromic molecule-polymer system in a solvent. Any suitable solvent can be used to disperse the photochromic molecule-polymer system. In some embodiments, one or more additives such as, for example, a binder material can be added along with the photochromic molecule-polymer system to form a coating solution. The coating solution can enable a process to create, for example, a uniform film coating for writing and/or erasing over the substrate 120. In various embodiments, the solvent can be volatile enough so that it can be conveniently removed during subsequent drying. Water can be used as a solvent for water soluble polymers such as poly(vinyl alcohol). Other suitable solvents can include, for example, halogenated and nonhalogenated solvents, such as tetrahydrofuran, trichloro- and tetrachloroethane, dichloromethane, chloroform, monochlorobenzene, toluene, acetone, methanol, ethanol, xylene, benzene, ethyl acetate and the like.

In various exemplary embodiments, the photochromic molecule-polymer system can be present in the photochromic layer 140, 240, 245 in an amount ranging from about 0.05% to about 99.5% by weight of the total photochromic layer 140, 240, 245. In some embodiments, the photochromic molecule-polymer system can be present in an amount ranging from about 0.1% to about 70% by weight of the total photochromic layer 140, 240, 245. In other embodiments, the photochromic molecule-polymer system can be present in an amount ranging from about 1% to about 20% by weight of the total photochromic layer 140, 240, 245.

In another embodiment, the solvent system with the photochromic molecule-polymer system can be encapsulated or microencapsulated, and the resultant capsules or microcapsules deposited or coated on the substrate as described above. Any suitable encapsulation technique can be used, such as simple and complex coacervation, interfacial polymerization, in situ polymerization, phase separation processes. For example, a process for creating encapsulated particles for electrophoretic displays, as disclosed in U.S. Pat. No. 6,067,185, which is incorporated by reference herein in its entirety, can be readily adapted to the present disclosure. Exemplary materials for simple coacervation can include, but are not limited to, gelatin, polyvinyl alcohol, polyvinyl acetate and cellulose derivatives. Exemplary materials for complex coacervation can include, but are not limited to, gelatin, acacia, acrageenan, carboxymethylecellulose, agar, alginate, casein, albumin, methyl vinyl ether-co-maleic anhydride. Exemplary materials for interfacial polymerization can include, but are not limited to, diacyl chlorides such as, for example, sebacoyl, adipoyl, and di or poly-amines or alcohols and isocyanates. Exemplary useful materials for in situ polymerization can include, but are not limited to, polyhydroxyamides, with aldehydes, melamine or urea and formaldehyde; water-soluble oligomers of the condensate of melamine or urea and formaldehyde, and vinyl monomers such as for example styrene, methyl methacrylate and acrylonitrile. Exemplary materials for phase separation processes can include, but are not limited to, polystyrene, polymethylmethacrylate, polyethylmethacrylate, ethyl cellulose, polyvinyl pyridine and polyacrylonitrile. In various embodiments, the encapsulating material can be transparent and colorless, to provide the full color contrast effect provided by the photochromic material.

In certain embodiments, where the photochromic molecule-polymer system is encapsulated, the resultant capsules can have any desired average particle size. For example, capsules can have an average size of from about 2 μm to about 1000 μm, such as from about 10 μm to about 600 μm, or from about 20 μm to about 100 μm, where the average size refers to the average diameter of the microcapsules and can be readily measured by any suitable device such as an optical microscope. In some embodiments, the capsules can be large enough to hold a suitable amount of photochromic molecule-polymer system to provide a visible effect when in the colored form, but are not so large as to prevent desired image resolution.

In various embodiments, the steps 351 and 352 can be repeated to form a plurality of photochromic molecule-polymer systems, each of the plurality of photochromic molecule-polymer systems having either a different photochromic molecule (PM) or a different polymer main chain. In certain embodiments, the step 353 of forming a coating solution of the photochromic molecule-polymer system in a solvent can include forming a coating solution of the plurality of photochromic molecule-polymer systems in one or more solvents.

The method 300 of forming an erasable medium can further include a step 354 of applying the coating solution over a substrate to form an imageable photochromic layer. Various coating techniques as known to one of ordinary skill in the art can be used to apply the coating solution over at least one side of the substrate 120, 220. An imageable photochromic layer or film can then be formed by drying, including evaporating and/or heating the applied coating solution containing the one or more photochromic molecule-polymer system. In various embodiments, the imageable photochromic layer can have a thickness from about 1 μm to about 1 mm, or in some cases from about 1 μm to about 100 μm, and particularly from about 2 μm to about 50 μm.

Figure 4:
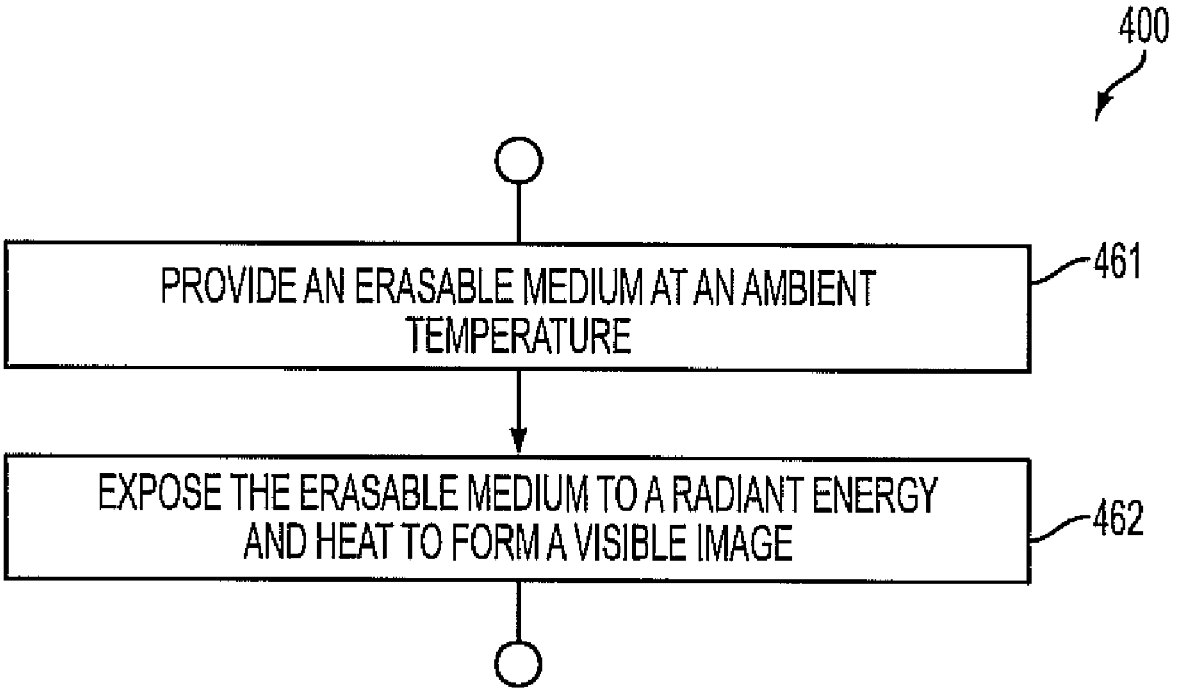
FIG. 4 depicts an exemplary method for using the erasable medium in accordance with various embodiments of the present teachings.

FIG. 4 depicts a method 400 of using an erasable medium in accordance with various embodiments of the present teachings. The method 400 can include a step 461 of providing an erasable medium, such as the erasable medium 100, 200 shown in FIGS. 1 and 2 at an ambient temperature. The method 400 can also include a step 462 of exposing a portion of the photochromic layer to both a radiant energy and thermal treatment to form a visible image on the erasable media.

In various embodiments, the visible image can be formed by heating the erasable medium at a temperature in the range of about 30° C. to about 150° C., in some case in the range of about 30° C. to about 125° C. and in some other cases in the range of about 30° C. to about 100° C. and exposing it to a radiant energy including UV light. In some cases, the radiant energy can have a wavelength in the range of about 200 nm to about 475 nm. In other embodiments, the radiant energy can have a single UV light wavelength of about 365 nm. In other embodiments, the radiant energy can have a wavelength band of from about 350 nm to about 370 nm. In various embodiments, the photochromic layer can be exposed to the radiant energy for a time period ranging from about 10 milliseconds to about 5 minutes, particularly from about 30 milliseconds to about 1 minute. The radiant energy can have an irradiance ranging from about 0.1 $mW/cm^2$ to about 100 $mW/cm^2$, particularly from about 0.5 $mW/cm^2$ to about 40 $mW/cm^2$.

In various exemplary embodiments, the radiant energy corresponding to the predetermined image can be generated by a radiant energy source, for example, by a computer on a light emitting diode (LED) array screen and the visible image can be formed or written on the erasable medium by placing the erasable medium 100, 200 on the LED screen for the period of time. In other exemplary embodiments, a UV raster output scanner (ROS) or a UV laser diode (LD) can be used to generate UV light to sensitize the one or more photochromic molecule-polymer systems from a colorless state to a colored state.

According to various exemplary implementations, the color contrast that renders the written image visible to an observer can be a contrast between, for example two, three or more different colors. The term "color" can encompass a number of aspects such as hue, lightness and saturation, where one color may be different from another color if the two colors differ in at least one aspect. For example, two colors having the same hue and saturation but different in lightness would be considered different colors. Any suitable colors such as, for example, red, white, black, gray, yellow and purple, can be used to produce a color contrast as long as the visible image is visible to the naked eye of a user. In various exemplary embodiments, the following exemplary color contrasts can be used: purple visible image on a white background; yellow visible image on a white background; dark purple visible image on a light purple background; or light purple visible image on a dark purple background.

The method 400 can further include removing the exposure to the radiant energy and returning the erasable medium to the ambient temperature, wherein upon the removal, the visible image can have an optical density difference with a background area of about 0.05 or more, in some cases an optical density difference of about 0.1 or more and in some other cases an optical density difference of about 0.2. In various exemplary embodiments, the color contrast of the visible image on the erasable medium can be maintained or readable under ambient light conditions for a period of time of at least several hours, such as, for example, for a period of about 4 hours to about 10 weeks or about 12 hours to about 5 weeks or in some cases for a period of about 24 hours to about 5 days. Yet, in some other embodiments, the color contrast of the visible image on the erasable medium can be maintained or readable without protection filter film for at least about 4 hours, in some cases for at least about 12 hours, and in some other cases of at least about 24 hours.

In various embodiments, the writability of the erasable medium can be characterized by optical density of the visible image written on the erasable medium 100, 200. Optical density (OD), also known as absorbance can be measured after certain period of time from the application of the first stimulus for writing. Optical density difference ΔOD can be determined by the difference between the optical density of the written image $OD_{image}$ and the optical density of the background areas $OD_{background}$. ΔOD can thus be used to characterize color contrast between the written image and the background areas. Contrast Ratio (CR) is defined as background reflectance/Image reflectance (i.e. $CR=R_{bkg}/R_{Image}$; $\Delta OD=\log_{10}(CR)$), where reflectance (R) is the ratio of reflected energy to the amount of incident energy and is related to optical density (OD) as follows:

$$OD=\log(1/R) \text{ or } R=1/(10^{OD})$$

The initial optical density difference ΔOD ($\Delta OD_{t=0}$) between the image and the surrounding background areas upon the application of the first stimulus for writing can be used to characterize initial writability of the erasable medium 100, 200. In various embodiments, the disclosed erasable medium can have an initial ΔOD ($\Delta OD_{t=0}$) of at least about 0.4, or at least about 0.5 or in some cases at least about 0.6.

Additionally, ΔOD can be used to characterize lifetime of a visible image, i.e., the lifetime of the color contrast between the written image and its background areas. When measuring, in embodiments, ΔOD can be normalized by dividing by initial ΔOD ($\Delta OD_{t=0}$) so that image lifetime can be fairly compared in terms of decoloration ratio.

In various embodiments, the erasable medium bearing the image can be erased by removing the color contrast between the exposed portion of the photochromic layer and the non-exposed region of the photochromic layer.

In various exemplary embodiments, erasure of the visible image can occur by any of the following: (i) changing the color of the portion of the photochromic layer exposed to the writing stimulus (radiant energy and heat) to the color of the region not exposed to the writing stimulus; (ii) changing the color of the non-exposed region to the color of the exposed region; or (iii) changing the color of the exposed region and the color of the non-exposed region to the same color different from both the exposed region color and the non-exposed region color.

The method 400 of using the erasable medium can also include a step 462 of erasing the visible image by heating the erasable medium at a temperature greater than the writing temperature, such as, for example, to a temperature in the range of about 70° C. or above, and in some cases in the range of about 80° C. to about 200° C. In other embodiments, the temperature for erasing can range from about 90° C. to about 100° C. In certain embodiments, an erasable medium bearing the visible image can be erased in an erase-on-demand manner. For example, the erasable medium bearing the visible image can be selectively exposed to a heat. The exposed portion of the photochromic layer for erasure can, for example, change from the colored state to the colorless state at a temperature of about 70° C. or above by a radiant energy source or a heat source, such as a radiant heater providing infrared (IR) irradiation, a hotplate or the like.

In various embodiments, for reusing the disclosed erasable medium, step 462 of exposing the erasable medium to the radiant energy and heat for writing can be performed at least one additional time.

Examples are set forth herein below and are illustrative of different amounts and types of reactants and reaction conditions that can be utilized in practicing the disclosure. It will be apparent, however, that the disclosure can be practiced with other amounts and types of reactants and reaction conditions than those used in the examples, and the resulting devices various different properties and uses in accordance with the disclosure above and as pointed out hereinafter.

EXAMPLES

Example 1

Preparation of a bis-hydroxylmethyl Photochrome

Figure 5:
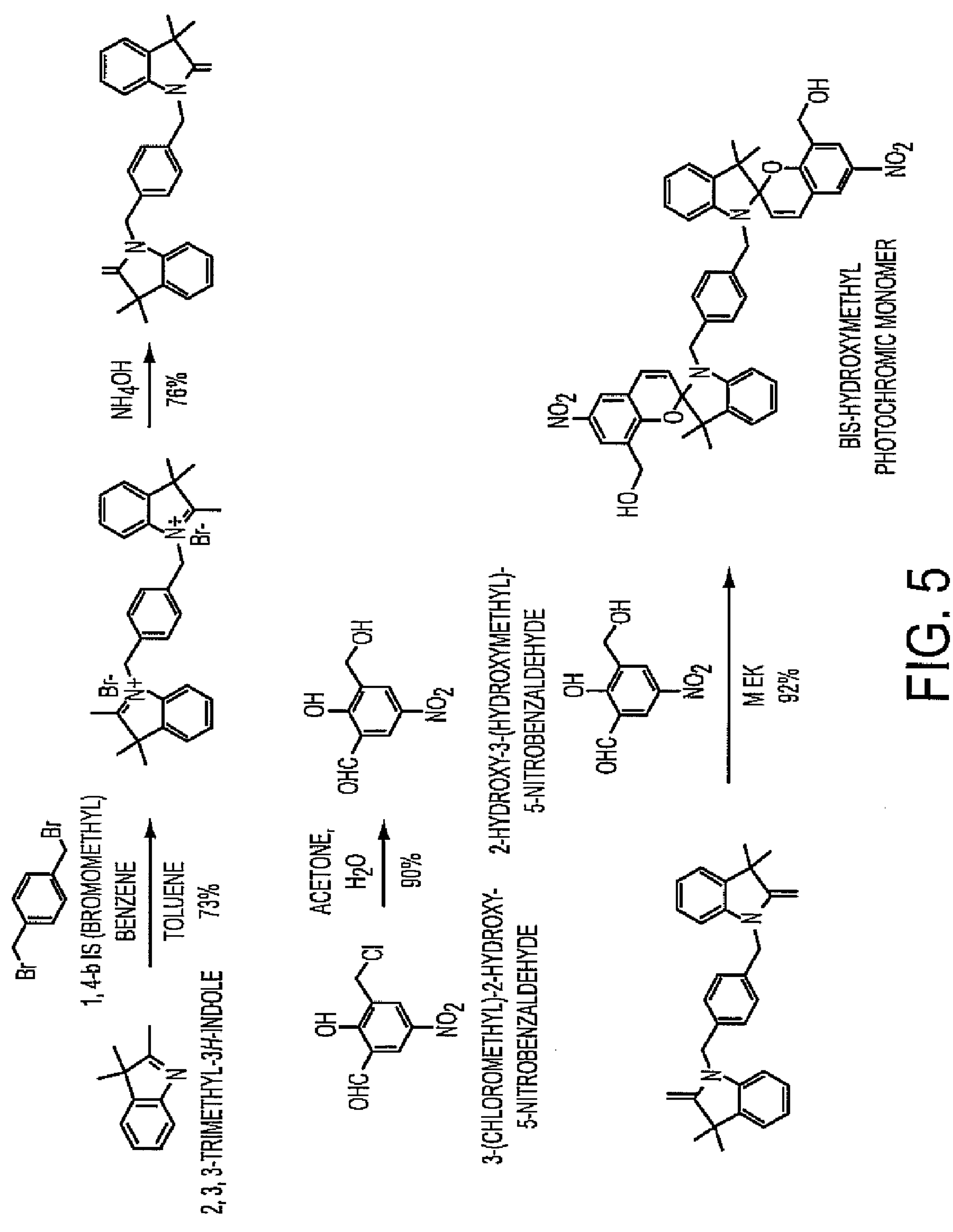
FIG. 5 shows an exemplary synthesis of a bis-hydroxylmethyl photochromic initiator.

FIG. 5 shows the synthesis of bis-hydroxylmethyl photochrome. U.S. Pat. Nos. 4,026,869 and 3,918,972; and U.S. patent application Ser. No. 12/400,276 describe the synthesis in detail, the disclosures of which are incorporated by reference in their entirety.

About 34.4 g of α,α'-dibromoparaxylene and about 41.5 g of 2,3,3-trimethyl-indolenine together with about 400 ml of toluene were refluxed while stirring for about 1 day. After cooling, the precipitate was filtered and washed with acetone to yield α,α'-bis[2,3,3-trimethyl-3H-indolium-yl(1)]-p-xylene-dibromide.

About 25 g of the latter product was dissolved in about 500 ml of water. After addition of about 60 ml of ammonium hydroxide the solution was treated with ether and dried over magnesium sulphate. The ether was evaporated. After triturated in cold ether a white precipitate of α,α'-bis[2-methylene-3,3-diimethylindolinyl(1)]-p-xylene-dibromide formed, which was filtered off.

About 9.6 g of the latter product and about 9.0 g of 4-hydroxymethyl-5-nitrosalicylaldehyde were dissolved in about 250 ml of methyl ethyl ketone (MEK) and the solution was refluxed for about 4 hours, whereafter the methyl ethyl ketone was distilled off. The residue was dissolved in dichloromethane and washed with aqueous $NaHCO_3$ solution, then dried over magnesium sulphate. After the solvent was distilled off bis-hydroxylmethyl photochrome was obtained.

Example 2

Preparation of Photochromic Molecule-Polymer System

Figure 6:
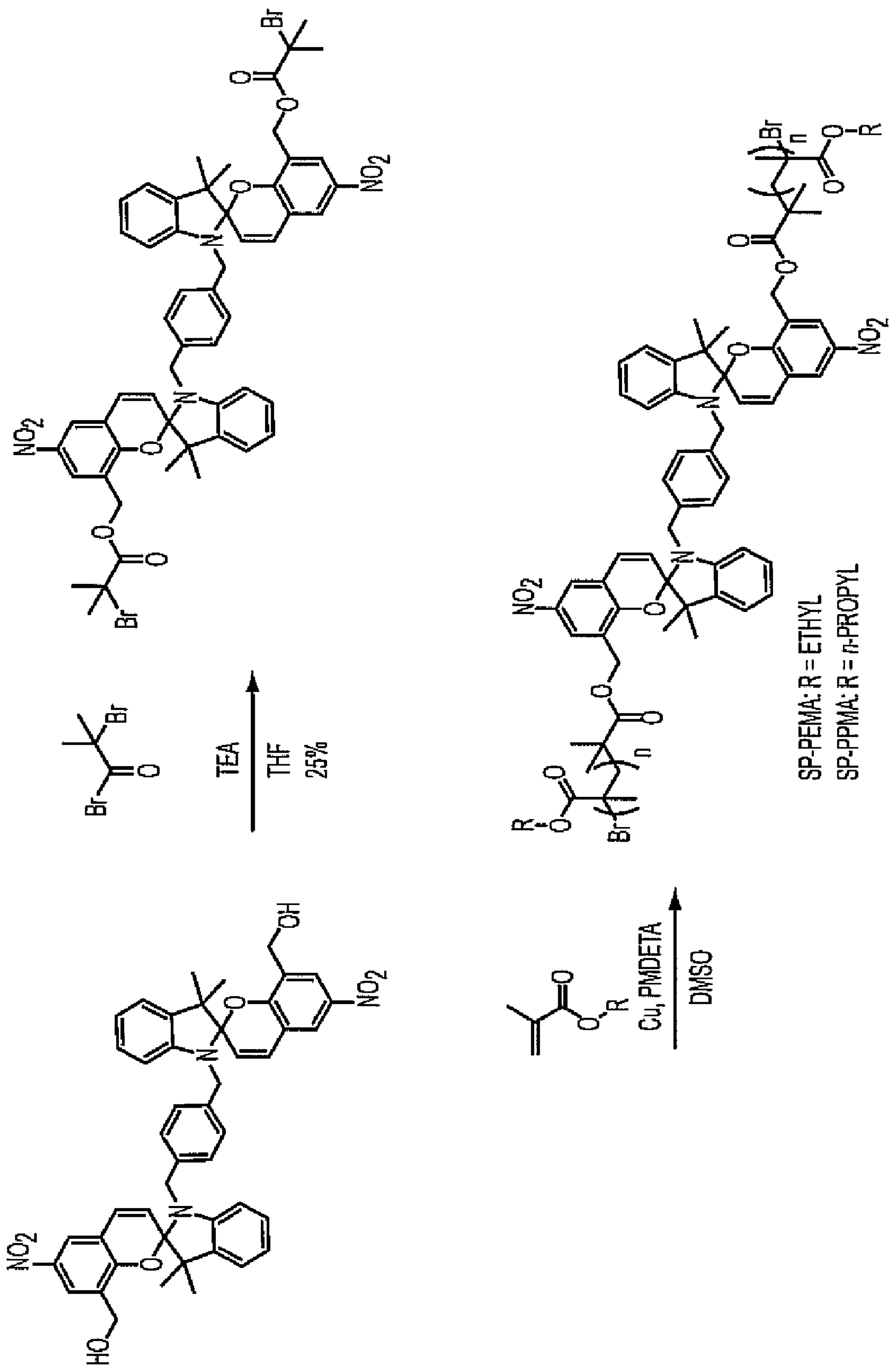
FIG. 6 shows the synthesis of spiropyran-poly(alkylmethacrylate) in accordance with various embodiments of the present teachings.

FIG. 6 shows the synthesis of spiropyran-poly(alkylmethacrylate).

About 0.7 g of bis-hydroxymethyl photochrome and about 0.38 ml of triethylamine were dissolved in about 15 ml of dry THF. About 0.62 g of 2-bromo-2-methylpropanoyl bromide in about 5 ml of THF was slowly added to the photochrome solution on an ice bath under argon. After slow addition of about 0.62 g of 2-bromo-2-methylpropanoyl bromide in about 5 ml of THF on an ice bath under argon, the ice bath was removed and the mixture was stirred for about 1.5 hours. The mixture was quenched with water and ether was added, washed with aqueous $NaHCO_3$ solution and water, then dried over $MgSO_4$. After the solvent was distilled off, silica gel column chromatography and following precipitation in hexane/toluene (8/2) gave photochromic initiator.

About 0.118 g of the latter product, about 0.028 g of Cu (powder), about 0.076 g of PMDETA, and about 3 ml of DMSO were added into a Schienk tube. About 5.62 g of propyl methacrylate was passed through basic alumina column and added to the tube and the mixture was degassed through 4 freeze-pump-thaw cycles. The tube was backfilled with argon and stirred at room temperature on a water bath. After about 2.5 hours, about 12 ml of THF was added and the solution was filtrated through about 1 micron glass fiber filter to remove Cu. The solution was added dropwise into about 900 ml of MeOH and resulting mass was dried under vacuum overnight to obtain SP-PPMA (molecular weight (Mw) =106000, and $T_g$=58° C.).

SP-PEMA (molecular weight (Mw)=73000, and $T_g$=81° C.) was synthesized by the same manner using ethyl methacrylate as the monomer.

Example 3

Synthesis of BPA-C7 Binder Polymer

About 81 g of bisphenol-A and about 100 ml of triethylamine were dissolved in about 860 ml of dichloromethane (DCM) and the solution was cooled with an ice bath. About 70 g of pimeloyl chloride in about 140 ml of DCM was slowly added and the reaction mixture was stirred at room temperature for about 2 hours. The reaction mixture was washed with water and dried over magnesium sulfate. After the solvent was distilled off, the concentrated solution was precipitated in hexane to obtain BPA-C7 binder polymer. The structure of BPA-C7 is shown below:

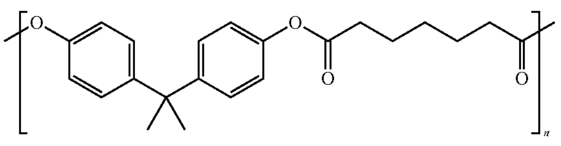

Example 4

Preparation of Erasable Media

About 180 mg of spiropyran-poly(ethylmethacrylate) (SP-PEMA) of Example 2 was added to about 1 ml solution of about 20 wt. % solution of a BPA-C7 of Example 3 in tetrahydrofuran to form a SP-PEMA coating solution.

The SP-PEMA coating solution was then coated over a DuraPaper (Xerox Corp., Norwalk, Conn.) substrate using a draw down coating procedure, and then dried in air overnight.

Similarly, about 180 mg of spiropyran-poly(propylmethacrylate) (SP-PPMA) of Example 2 was added to about 1 ml solution of about 20 wt. % solution of a BPA-C7 (binder polymer) of Example 3 in tetrahydrofuran to form a SP-PPMA coating solution. The SP-PPMA coating solution was then coated over a Dura paper substrate using a draw down coating procedure, then dried in air overnight.

Example 5

Writing on the Erasable Media of Example 4

The prepared erasable medium samples of Example 3 were irradiated with a UV LED at a wavelength of about 365 nm at a speed of about 2.5 ppm while heating at about 70° C. After writing, the samples were kept in standard room light conditions (fluorescent bulbs; 400 lux) without yellow protection and optical density for written ($OD_{Image}$) and for background ($OD_{Bkg}$) was measured using reflection spectrometry at regular intervals of time using Spectrolino Spectrophotometer (GretagMacbeth, New Windsor, N.Y.). The optical density results are shown below in Table 1.

TABLE 1

| | | Time = 0 | | | Time = 40 hours | | | Time = 96 hours | | |
|---|---|---|---|---|---|---|---|---|---|---|
| # | Polymer | OD Image | OD Bkg | ΔOD (t0) | OD Image | OD Bkg | ΔOD (40 h) | OD Image | OD Bkg | ΔOD (96 h) |
| 1 | SP-PEMA | 0.87 | 0.05 | 0.82 | 0.55 | 0.13 | 0.42 | 0.47 | 0.16 | 0.31 |
| 2 | SP-PPMA | 1.02 | 0.05 | 0.97 | 0.54 | 0.19 | 0.35 | 0.44 | 0.21 | 0.23 |

In Table 1, the ΔOD was determined by the difference between $OD_{Image}$ and $OD_{Bkg}$, and was used to characterize color contrast (in terms of Contrast Ratio) between the image and the background area.

As shown in Table 1, the sample #1 (SP-PEMA) showed initially (at t=0) contrast of ΔOD=0.82 (Contrast Ratio=6.6) and after about 40 hours in room light conditions a contrast of ΔOD=0.42 (Contrast Ratio=2.6). Even after about 96 hours in room light, the sample showed a detectable contrast of ΔOD=0.31 (Contrast Ratio=2).

The materials disclosed in accordance with present teachings have significant image stability when compared with the standard first generation of reusable paper (spiropyran coated with polymer binder) which fades completely in about 1 day in standard room light conditions. It should also be noted that OD of background increased a little bit over the time, but it was not significant. No yellow protection was required while the samples kept long image lifetime.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. An erasable medium comprising:

a substrate; and a photochromic layer disposed over the substrate, the photochromic layer comprising one or more photochromic molecule-polymer systems, wherein each of the one or more photochromic molecule-polymer systems comprises a photochromic molecule covalently bonded within a polymer main chain as shown below, the photochromic molecule comprising two or more photochromic moieties (PM) linked together via a linker:

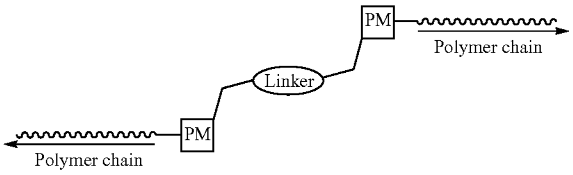

wherein each polymer chain is a polyalkylmethacrylate, a polycarbonate, a polystyrene, a polysulfone, a polyethersulfone, a polyarylsulfone, a polyarylether, a polyolefin, a polyacrylate, a polyvinyl derivative, a cellulose derivative, a polyurethane, a polyester, a silicone resin, an epoxy resin, a polyvinyl alcohol, a polyacrylic acid, a polystyrene-acrylonitrile, a polyethylene-acrylate, a vinylidenechloride-vinylchloride copolymer, a vinylacetate-vinylidene chloride copolymer, or a styrene-alkyd resin, wherein the photochromic moieties are the same or different, and wherein each of the one or more photochromic molecule-polymer systems has a glass transition temperature in the range of about 30° C. to about 150° C.

2. The erasable medium of claim 1, wherein a portion of the photochromic layer changes from a colorless state to a colored state upon exposure to a temperature in the range of about 30° C. to about 150° C. and a radiant energy.

3. The erasable medium of claim 2, wherein the portion of the photochromic layer has an image lifetime of at least about 4 hours.

4. The erasable medium of claim 2, wherein the portion of the photochromic layer changes from the colored state to the colorless state upon exposure to a temperature in the range of about 30° C. to about 100° C.

5. The erasable medium of claim 1, wherein each photochromic moiety (PM) is selected from the group consisting of spiropyrans, spirooxazines, thiospiropyrans, benzos, naphthopyrans, stilbenes, azobenzenes, bisimidazols, spirodihydroindolizines, quinines, perimidinespirocyclohexadienones, viologens, fulgides, fulgimides, diarylethenes, hydrazines, anils, aryl thiosulfonates, and spiroperimidines, and wherein the linker is selected from the group consisting of sulphur, oxygen, nitrogen, a linear alkyl, a branched alkyl, a cyclic alkyl, unsaturated hydrocarbon, an aryl, an arylalkyl, a heteroaryl group, an ester group, a ketone, an ether group, an amide group, a thioester group, and a thionoester group.

6. The erasable medium of claim 1, wherein the photochromic layer comprises one or more of spiropyran-poly(ethylmethacrylate) and spiropyran-poly(n-propylmethacrylate).

7. The erasable medium of claim 1, wherein the linker is selected from the group consisting of sulphur, oxygen, nitrogen, a linear alkyl, a branched alkyl, a cyclic alkyl, a heteroaryl group, an ester group, a ketone, an ether group, an amide group, a thioester group, and a thionoester group, and wherein the substrate is selected from the group consisting of paper, glass, ceramic, wood, plastic, fabric, textile, metal, plain paper, coated paper, no tear paper, and mixtures thereof.

8. The erasable medium of claim 1, wherein the photochromic layer further comprises an optional polymer binder selected from the group consisting of polyalkylmethacrylate, polycarbonate, polystyrene, polysulfone, polyethersulfone, polyarylsulfone, polyarylether, polyolefin, polyacrylate, polyvinyl derivative, cellulose derivatives, polyurethanes, polyamides, polyimides, polyesters, silicone resins, epoxy resins, polyvinyl alcohols, polyacrylic acids, and copolymers or mixtures thereof.

9. The erasable medium of claim 1 further comprising a second photochromic layer disposed over the substrate on a side opposite to the photochromic layer, the second photochromic layer comprising one or more photochromic molecule-polymer systems.

10. A method of forming an erasable medium comprising:

(a) forming a photochromic initiator, the photochromic initiator comprising two or more photochromic moieties (PM) linked together via a linker as shown below, each of the photochromic moieties (PM) comprising at least one functional group (X) capable of initiating polymerization:

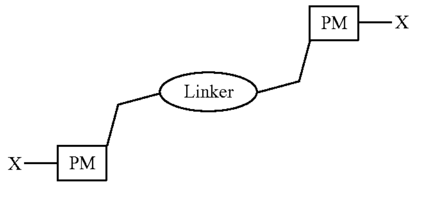

(b) forming a photochromic molecule-polymer system by initiating at least one of living radical polymerization, radical polymerization, anionic polymerization, cationic polymerization, or metal mediated polymerization using the at least two functional groups (X) to form a photochromic molecule covalently bonded within a polymer main chain as shown below, the photochromic molecule comprising the two or more photochromic moieties (PM) linked together via the linker:

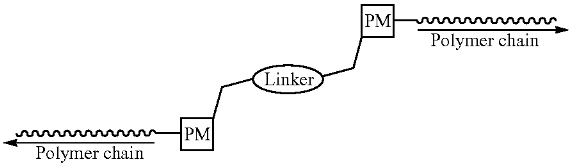

wherein each polymer chain is a polyalkylmethacrylate, a polycarbonate, a polystyrene, a polysulfone, a polyethersulfone, a polyarvlsulfone, a polvarylether, a polyolefin, a polyacrylate, a polyvinyl derivative, a cellulose derivative, a polyurethane, a polyester, a silicone resin, an epoxy resin, a polyvinyl alcohol, a polyacrylic acid, a polvstyrene-acrylonitrile, a polyethylene-acrylate, a vinylidenechloride-vinylchloride copolymer, a vinylacetate-vinylidene chloride copolymer, or a styrene-alkyd resin, wherein the photochromic moieties are the same or different, and wherein the photochromic molecule-polymer systems has a glass transition temperature in the range of about 30° C. to about 150° C.;

(c) forming a coating solution of the photochromic molecule-polymer system in a solvent; and (d) applying the coating solution over a substrate to form an imageable photochromic layer.

11. The method of forming an erasable medium according to claim 10, wherein each photochromic moiety (PM) is selected from the group consisting of spiropyrans, spirooxazines, thiospiropyrans, benzos, naphthopyrans, stilbenes, azobenzenes, bisimidazols, spirodihydroindolizines, quinines, perimidinespirocyclohexadienones, viologens, fulgides, fulgimides, diarylethenes, hydrazines, anils, aryl thiosulfonates, and spiroperimidines.

12. The method of forming an erasable medium according to claim 10, wherein the at least one functional group (X) is selected from the group consisting of an alkyl halide, a 2,2,6,6-tetramethylpiperidinyloxy (TEMPO) group, and a dithioester group.

13. The method of forming an erasable medium according to claim 10, wherein the step of forming a photochromic molecule-polymer system further comprises:

adding one or more of copper, N,N,N',N',N''-pentamethyldiethylenetriamine (PMDETA), tris(2-aminoethyl) amine (TREN), tris(2-dimethylaminoethyl)amine ($Me_6$-TREN), poly(ethylene imine) (PEI), N-n-propyl-2-pyridyl-methanimine, 2,2'-bipyridine (bpy); and adding one or more monomers selected from the group consisting of alkylmethacrylate, alkylacrylate, acrylamide, vinyl monomer, styrene, and acrylonitrile.

14. The method of forming an erasable medium according to claim 10, further comprising repeating steps (a) and (b) to form a plurality of photochromic molecule-polymer systems.

15. The method of forming an erasable medium according to claim 10, wherein the step of forming a coating solution of the photochromic molecule-polymer system in a solvent comprises forming a coating solution of the plurality of photochromic molecule-polymer systems in one or more solvents.

16. The method of forming an erasable medium according to claim 10, wherein the step of applying the coating solution over a substrate comprises applying the coating solution on two sides of the substrate to form an erasable medium with two photochromic layers.

17. The method of forming an erasable medium according to claim 10, wherein the linker is selected from the group consisting of sulphur, oxygen, nitrogen, a linear alkyl, a branched alkyl, a cyclic alkyl, a heteroaryl group, an ester group, a ketone, an ether group, an amide group, a thioester group, and a thionoester group, and wherein the step of applying the coating solution over the substrate comprises applying the coating solution over the substrate selected from the group consisting of paper, glass, ceramic, wood, plastic, fabric, textile, metal, plain paper, coated paper, no tear paper and mixtures thereof.

18. A method of using an erasable medium comprising:

providing an erasable medium at an ambient temperature, the erasable medium comprising at least one photochromic layer disposed over a substrate, the at least one photochromic layer comprising one or more photochromic molecule-polymer systems, wherein each of the one or more photochromic molecule-polymer systems comprises a photochromic molecule covalently bonded within a polymer main chain as shown below, the photochromic molecule comprising two or more, photochromic moieties (PM) linked together via a linker:

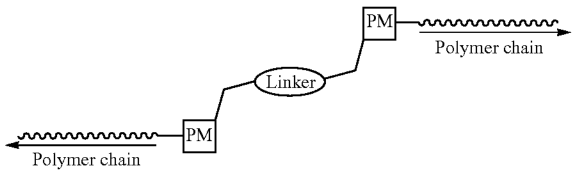

wherein each polymer chain is a polyalkylmethacrylate, a polycarbonate, a polystyrene, a polysulfone, a polyethersulfone, a polyarylsulfone, a polyarylether, a polyolefin, a polyacrylate, a polyvinyl derivative, a cellulose derivative, a polyurethane, a polyester, a silicone resin, an epoxy resin, a polyvinyl alcohol, a polyacrylic acid, a polystyrene-acrylonitrile, a polyethylene-acrylate, a vinylidenechloride-vinylchloride copolymer, a vinylacetate-vinylidene chloride copolymer, or a styrene-alkyd resin, wherein the photochromic moieties are the same or different, and wherein each of the one or more photochromic molecule-polymer systems has a glass transition temperature in the range of about 30° C. to about 150° C., and exposing a portion of the photochromic layer to both a radiant energy and a temperature in the range of about 30° C. to about 100° C. to form a visible image on the erasable media.

19. The method of claim 18 further comprising:

removing the exposure to the radiant energy; and returning the erasable medium to the ambient temperature.

20. The method of claim 19, wherein the visible image has an image lifetime of at least about 4 hours.

21. The method of using an erasable medium according to claim 19 further comprising erasing the visible image by heating the erasable medium at a temperature higher than the writing temperature.

22. The method of using an erasable medium according to claim 19, wherein the photochromic layer comprises one or more of spiropyran-poly(ethylmethacrylate) and spiropyran-poly(n-propylmethacrylate).

23. The erasable medium of claim 1, wherein the linker is selected from the group consisting of sulphur, oxygen, nitrogen, a linear alkyl, a branched alkyl, a cyclic alkyl, a heteroaryl group, an ester group, a ketone, an ether group, an amide group, a thioester group, and a thionoester group.

* * * * *